(12) United States Patent
Brush, IV et al.

(10) Patent No.: US 10,884,023 B2
(45) Date of Patent: Jan. 5, 2021

(54) TEST FIXTURE FOR OBSERVING CURRENT FLOW THROUGH A SET OF RESISTORS

(71) Applicant: Keysight Technologies, Inc., Santa Rosa, CA (US)

(72) Inventors: Edward Vernon Brush, IV, Colorado Springs, CO (US); Neil Martin Forcier, Fort Collins, CO (US); Fei Fred Wang, Knoxville, TN (US); Zheyu Zhang, Knoxville, TN (US); Wen Zhang, Knoxville, TN (US)

(73) Assignee: Keysight Technologies, Inc., Santa Rosa, CA (US)

( * ) Notice: Subject to any disclaimer, the term of this patent is extended or adjusted under 35 U.S.C. 154(b) by 0 days.

(21) Appl. No.: 16/864,344

(22) Filed: May 1, 2020

(65) Prior Publication Data

US 2020/0256890 A1 Aug. 13, 2020

Related U.S. Application Data

(62) Division of application No. 15/843,723, filed on Dec. 15, 2017, now Pat. No. 10,670,626.

(51) Int. Cl.
*G01R 1/04* (2006.01)
*G01R 31/50* (2020.01)

(52) U.S. Cl.
CPC ........... *G01R 1/0416* (2013.01); *G01R 1/045* (2013.01); *G01R 31/50* (2020.01)

(58) Field of Classification Search
CPC .. G01R 1/06772; G01R 1/0408; G01R 27/32; G01R 31/02; G01R 31/2808;
(Continued)

(56) References Cited

U.S. PATENT DOCUMENTS

| 4,994,771 A | 2/1991 | Takamine et al. |
| 5,046,966 A | 9/1991 | Snyder et al. |
(Continued)

FOREIGN PATENT DOCUMENTS

| CN | 102650660 B | 7/2014 |
| SU | 516107 A1 | 5/1976 |

OTHER PUBLICATIONS

Chinese Notification of the Decision to Grant dated Dec. 10, 2019 for application No. 201822109228.0 with English translation, 6 pgs.
(Continued)

*Primary Examiner* — Vinh P Nguyen

(57) ABSTRACT

The illustrative embodiments pertain to a test fixture having low insertion inductance for large bandwidth monitoring of current signals. In one exemplary embodiment, the test fixture includes a baseplate with each resistor of a set of resistors embedded inside a respective non-plated through slot in the baseplate. A first terminal of each resistor is soldered to a top metallic zone of the baseplate and a second terminal soldered to a first of two bottom metallic zones of the baseplate. The top metallic zone is connected by plated-through holes to a second of the two bottom metallic zones. When mounted upon a PCB, the test fixture allows current flow from the first bottom metallic zone, upwards through the set of resistors to the top metallic zone, and downwards to the second bottom metallic zone. An observation instrument may be coupled to a coaxial connector that is mounted on the baseplate.

5 Claims, 9 Drawing Sheets

(58) Field of Classification Search
CPC ...... G01R 31/2837; G01R 1/04; G01R 27/16; G01R 27/2617; G01R 29/26; G01R 31/001; G01R 31/021; G01R 31/046; G01R 31/315; G01R 31/31905; H01R 24/50; H01R 12/52; H01R 12/714; H01R 13/2414; H01R 23/26
See application file for complete search history.

(56) References Cited

U.S. PATENT DOCUMENTS

| | | | |
|---|---|---|---|
| 5,823,790 A | 10/1998 | Magnuson | |
| 6,639,154 B1 | 10/2003 | Cartier et al. | |
| 7,262,590 B2 * | 8/2007 | Nakajima | G01R 1/0408 324/750.25 |
| 7,548,069 B2 * | 6/2009 | Simpson | G01R 27/28 324/537 |
| 7,750,764 B2 | 7/2010 | Snodgrass et al. | |
| 10,037,933 B2 * | 7/2018 | Treibergs | H05K 5/04 |
| 2002/0047772 A1 | 4/2002 | Chang | |

OTHER PUBLICATIONS

Torsten Funck, "AC-DC Disk Resistors Made of Surface Mount Components," IEEE Transactions of Instrumentation and Measurement, vol. 66. No. 6, Jun. 2017.

Umberto Pogliano, "Coaxial Shunts as AC-DC Transfer Standards of Current," IEEE Transactions of Instrumentation and Measurement, vol. 58. No. 4, Apr. 2009.

English language machine-translation of SU516107.

English language machine-translation of CN102650660B.

20170584-01_ TandM_Research_Products (printed image of company website).

* cited by examiner

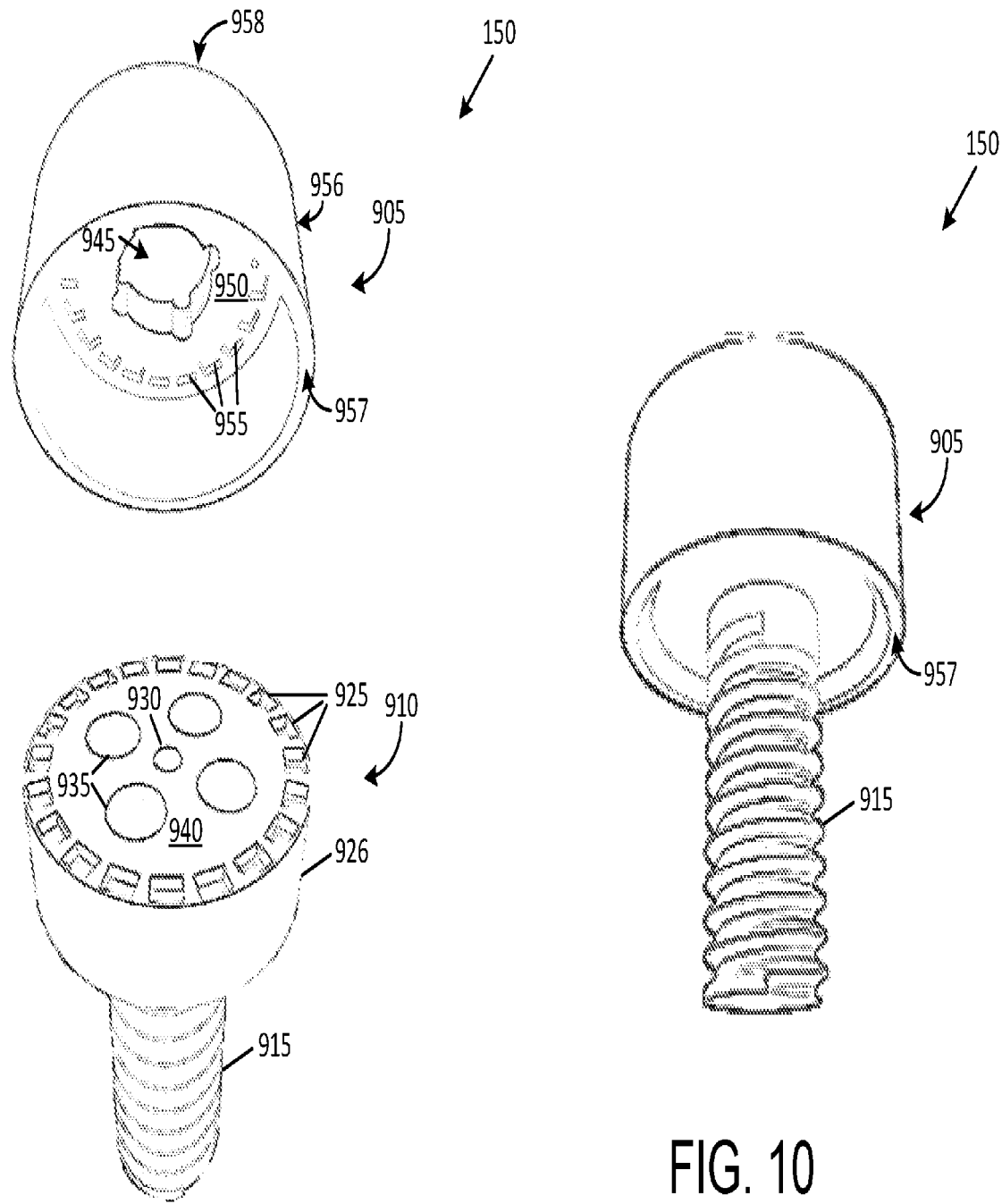

TEST FIXTURE FOR OBSERVING CURRENT FLOW THROUGH A SET OF RESISTORS

CROSS-REFERENCE TO RELATED APPLICATIONS

The present application is a divisional application of U.S. patent application Ser. No. 15/843,723 under 35 U.S.C. § 120 naming Edward Vernon BRUSH IV, et al. as inventors, and filed on Dec. 15, 2017, now U.S. Pat. No. 10,670,626. The entire disclosure of patent application Ser. No. 15/843,723 is specifically incorporated by reference herein.

BACKGROUND

Resistors are used in electronic circuits for various reasons such as for limiting current flow, or for producing a voltage drop in a voltage supply line. Resistors may also be used in signal monitoring systems for observing signals present in an electronic circuit. When used as part of a signal monitoring system, a resistor is typically configured not to interfere or to modify a signal being monitored. For example, a low value resistor may be connected to a part of an electronic circuit to monitor the current signal flowing through the resistor and an observation instrument such as an oscilloscope coupled to the resistor. The voltage generated across the resistor can be observed on the oscilloscope in order to obtain information about the current signal. Such an arrangement works quite effectively when the signal is a DC signal or a time-varying signal having a frequency that is relatively low. However, when the circuit is a radio-frequency (RF) circuit, the inherent inductance presented by the various parts of a resistor, particularly a leaded resistor, may introduce distortion or disturbance into an RF signal propagating through the RF circuit.

The shortcomings associated with using a leaded resistor in high frequency circuits may be alleviated to some extent by using resistors that do not have leads (surface mount resistors, for example). However other factors such as the inductance contribution of metal tracks used for interconnecting the surface mount resistors; wires used for connecting the surface mount resistors with other circuit components; leads present in other components such as RF connectors; and component layout close to surface mount resistors, can have an adverse impact upon RF signals, particularly RF signals at higher frequencies.

It is therefore generally desirable to minimize the inductance contribution of various components, such as resistors and current propagation paths, in a signal monitoring system that is used for observing RF signals in RF circuits.

SUMMARY

According to another exemplary embodiment of the present disclosure, a test fixture includes a baseplate, a coaxial connector, and a set of resistors. The baseplate includes a first major surface comprising a first metallic zone and a second major surface on a reverse side of the first major surface, the second major surface comprising a second metallic zone and a third metallic zone, the second metallic zone electrically isolated from the first metallic zone and the third metallic zone, the third metallic zone electrically connected to the first metallic zone. The baseplate further includes a set of non-plated through slots extending from the first major surface to the second major surface. The coaxial connector is mounted on the baseplate, the coaxial connector having at least one of a first terminal or a flange soldered to the first metallic zone and at least a second terminal connected to the second metallic zone. Each of the set of resistors is embedded in a respective slot in the set of non-plated through slots, each of the set of resistors having a first terminal connected to the first metallic zone and a second terminal connected to the second metallic zone.

According to yet another exemplary embodiment of the present disclosure, a test fixture includes a coaxial connector, a baseplate, an electrically-conductive casing, and a set of resistors. The coaxial connector has a first terminal that is connected to a center pin of the coaxial connector. The baseplate includes an electrically-conductive mounting rod extending from a bottom surface of the baseplate and a first metallic zone located on a top surface of the baseplate. The baseplate further includes a plated-through orifice extending from the first metallic zone and into a portion of the electrically-conductive mounting rod. The plated-through orifice is configured to accommodate a press-fit insertion of the first terminal of the coaxial connector and provide electrical conductivity between the first terminal of the coaxial connector, the first metallic zone, and the electrically-conductive mounting rod. The electrically-conductive casing includes a top surface configured for mounting the coaxial connector and a central opening through which extends one or more terminals of the coaxial connector that is mounted upon the top surface of the electrically-conductive casing, the one or more terminals of the coaxial connector including the first terminal that is connected to the center pin of the coaxial connector. The electrically-conductive casing also includes a rim portion having a bottom edge that is substantially aligned with the bottom surface of the baseplate, the rim portion electrically connected to a cylindrical body portion of the coaxial connector through the electrically-conductive casing. A first planar terminal of each respective resistor in the set of resistors is placed in contact with the first metallic zone located on the top surface of the baseplate and a second planar terminal of each respective resistor in the set of resistors is placed in contact with an inner surface of the electrically-conductive casing when the baseplate is encased by the electrically-conductive casing.

Other embodiments and aspects of the present disclosure will become apparent from the following description taken in conjunction with the following drawings.

BRIEF DESCRIPTION OF THE FIGURES

Many aspects of the invention can be better understood by referring to the following description in conjunction with the accompanying claims and figures. Like numerals indicate like structural elements and features in the various figures. For clarity, not every element may be labeled with numerals in every figure. The drawings are not necessarily drawn to scale; emphasis instead being placed upon illustrating the principles of the invention. The drawings should not be interpreted as limiting the scope of the invention to the example embodiments shown herein.

FIG. 9 shows an exploded view of an alternative exemplary embodiment of the test fixture shown in FIG. 1.

FIG. 10 shows an assembled view of the alternative exemplary embodiment shown in FIG. 9.

DETAILED DESCRIPTION

Figure 1:
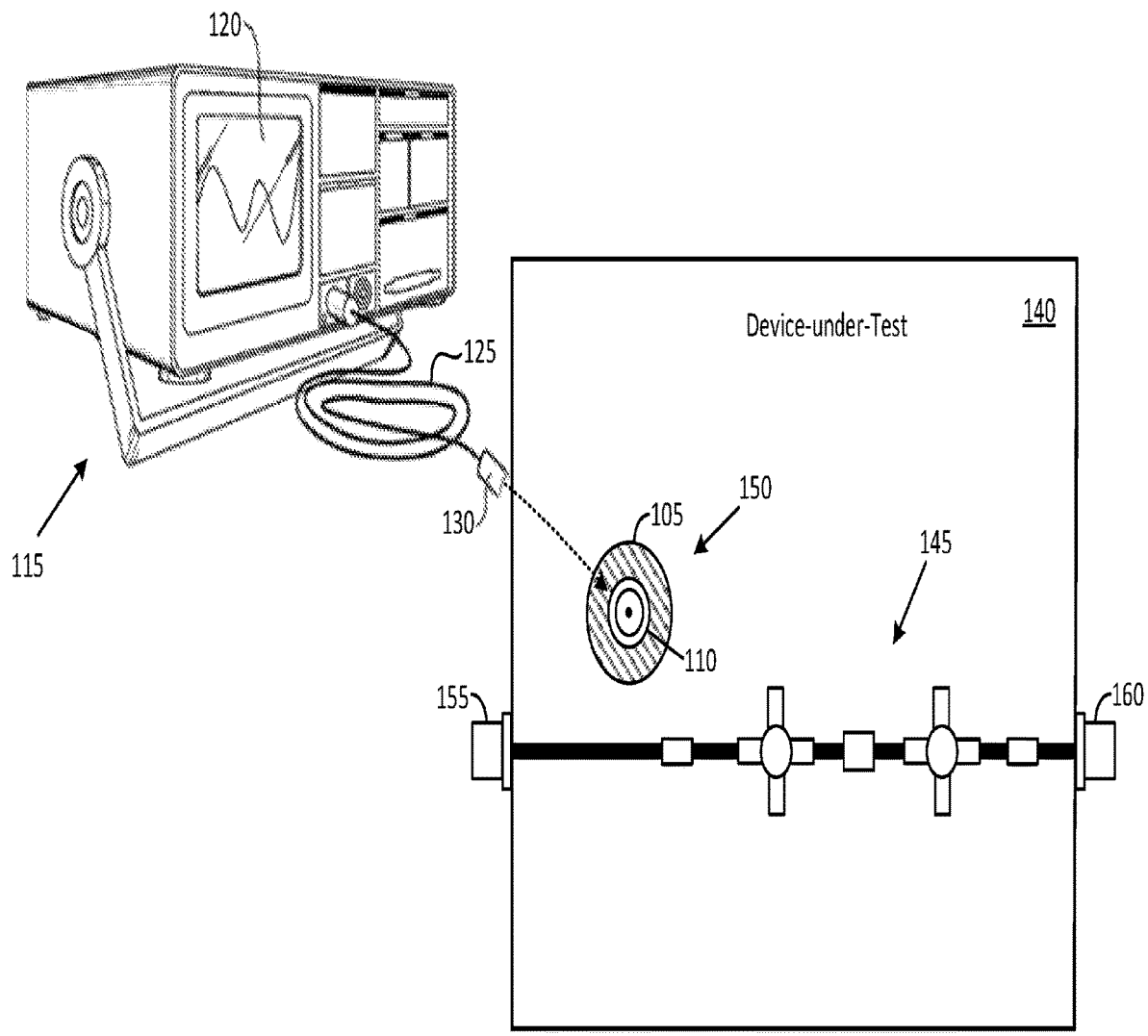
FIG. 1 shows a system that includes an exemplary test fixture for observing current flow through a set of resistors in accordance with an exemplary embodiment of the disclosure.

Throughout this description, embodiments and variations are described for the purpose of illustrating uses and implementations of inventive concepts. The illustrative description should be understood as presenting examples of inventive concepts, rather than as limiting the scope of the concepts as disclosed herein. Towards this end, certain words and phrases are used herein solely for convenience and such words and terms should be broadly understood as encompassing various objects and actions that are generally understood in various forms and equivalencies by persons of ordinary skill in the art. It should be understood that some of these words may be used interchangeably in some cases.

For example, it should be understood that "electrically coupled" or "electrically connected" as used herein generally pertains to a connection that is provided by a metal element, such as, for example, a metal track on a printed circuit board or a solder deposit interconnecting two objects. The word "mounted" as used herein generally refer to a first object that is soldered or press-fitted to a second object (such as a resistor or a connector that is soldered or press-fitted on to a printed circuit board). The phrase "configured to" or "configured for" as used herein generally refers to an object having a physical structure and/or capability to execute an action that is described in the context of the phrase. It should also be understood that words such as "example" and "exemplified" as used herein are intended to be non-exclusionary and non-limiting in nature. More particularly, the word "exemplary" as used herein indicates one among several examples and it should be understood that no special emphasis, exclusivity, or preference, is associated or implied by the use of this word.

Generally, the various illustrative embodiments disclosed herein pertain to a test fixture for observing current flow through a set of resistors that are connected in parallel with each other. In one exemplary embodiment, the test fixture includes a coaxial connector soldered to a baseplate. Each of the set of resistors is embedded inside a respective slot in a set of through-slots that surround the coaxial connector. Each resistor has one terminal soldered to a first metallic zone located on a top surface of the baseplate and a second terminal soldered to one of two metallic zones located on a bottom surface of the baseplate. The first metallic zone on the top surface is electrically connected to the other of the two metallic zones on the bottom surface of the baseplate by a number of plated-through holes. When the test fixture is soldered to a printed circuit board (PCB) of a device-under-test (DUT), current flows from the DUT into one of the two metallic zones on the bottom surface of the baseplate, upwards through the set of resistors into the first metallic zone located on the top surface, downwards to the other metallic zone in the bottom surface of the baseplate, and back to the DUT. The mounting pins of the coaxial connector are electrically connected to the first metallic zone on the top surface of the baseplate and a center pin of the coaxial connector is electrically connected to the other of the two metallic zones on the bottom surface of the baseplate, thereby allowing for coupling of an observation instrument to the coaxial connector for observing a voltage drop across the set of resistors. The test fixture provides a small footprint, low inductance, large bandwidth arrangement for evaluating various characteristics of various types of currents that may be present in a DUT. In one exemplary implementation, a test fixture in accordance with the disclosure provides about 0.1 nH of inductance in a current flow path through the test fixture. In contrast, a conventional test fixture incorporating a pair of concentric tubes provides about 3 nH of inductance in a current flow path through the conventional test fixture. The pair of concentric test tubes of this conventional test fixture includes a resistive inner tube and a copper outer tube, the size of the resistive tube determined by a desired resistance value in the current flow path. The conventional test fixture is generally bulky in size and can have significant inductance.

FIG. 1 shows a system 100 that includes an exemplary test fixture 150 for observing current flow through a set of resistors in a device-under-test (DUT) 140 in accordance with an exemplary embodiment of the disclosure. The DUT 140 can be any of various types of electronic circuits and more particularly electronic circuits operating in a radio-frequency (RF) region. Accordingly, in this exemplary embodiment, the DUT 140 includes an RF circuit 145 that has several RF transistors connected together in the form of an RF amplifier to provide amplification to an input signal coupled into an input connector 155 of the DUT 140. The amplified signal is available at an output connector 160 of the DUT 140. Various other components such as resistors, capacitors, and inductors are not shown. Other exemplary embodiments may include other types of circuits on the DUT 140, such as a switched mode power supply circuit wherein the test fixture 150 may be used to observe pulsed currents.

A user of the DUT 140 may desire to observe current flow through a portion of the RF circuit 145 and uses the test fixture 150 to do so in accordance with various exemplary embodiments of the disclosure. In this exemplary implementation, the test fixture 150 is soldered on to a top surface of the DUT 140 and current from the RF circuit 145 flows into a metallic area located on the bottom surface of a baseplate 105 of the test fixture 150. The current then passes through a set of resistors (not shown) that are embedded in the baseplate 105. The set of resistors are connected in parallel with each other. A coaxial connector 110 that is connected to the baseplate 105 is used to couple an observation instrument for observing a voltage drop across the set of resistors. In this example embodiment, the observation instrument is an oscilloscope 115. The oscilloscope 115 includes a probe 125 having a connector 130 that mates with the coaxial connector 110 on the test fixture 150. Other observation instruments, such as a voltmeter, a waveform analyzer, or a spectrum analyzer, may be coupled to the coaxial connector 110 in place of the oscilloscope 115.

The characteristics of the current propagating through the set of resistors can be evaluated by observing the voltage drop across the set of resistors on a display screen 120 of the oscilloscope 115. The test fixture 150 is configured to cause minimal impact upon the operations of the RF circuit 145 and to produce a waveform that accurately reflects the current flowing through the set of resistors. In one exemplary implementation, each of the set of resistors is a surface mount resistor that is embedded into the baseplate 105 and the end terminals of the resistors soldered on to metallic zones on top and bottom surfaces of the baseplate 105. This arrangement minimizes undesirable inductive contributions from wires and leads as may occur if leaded resistors were used in a traditional manner by mounting the leaded resistors on the top surface of the DUT 140 for observing current flow in the RF circuit 145.

Figures 2A, 2B, 2C:
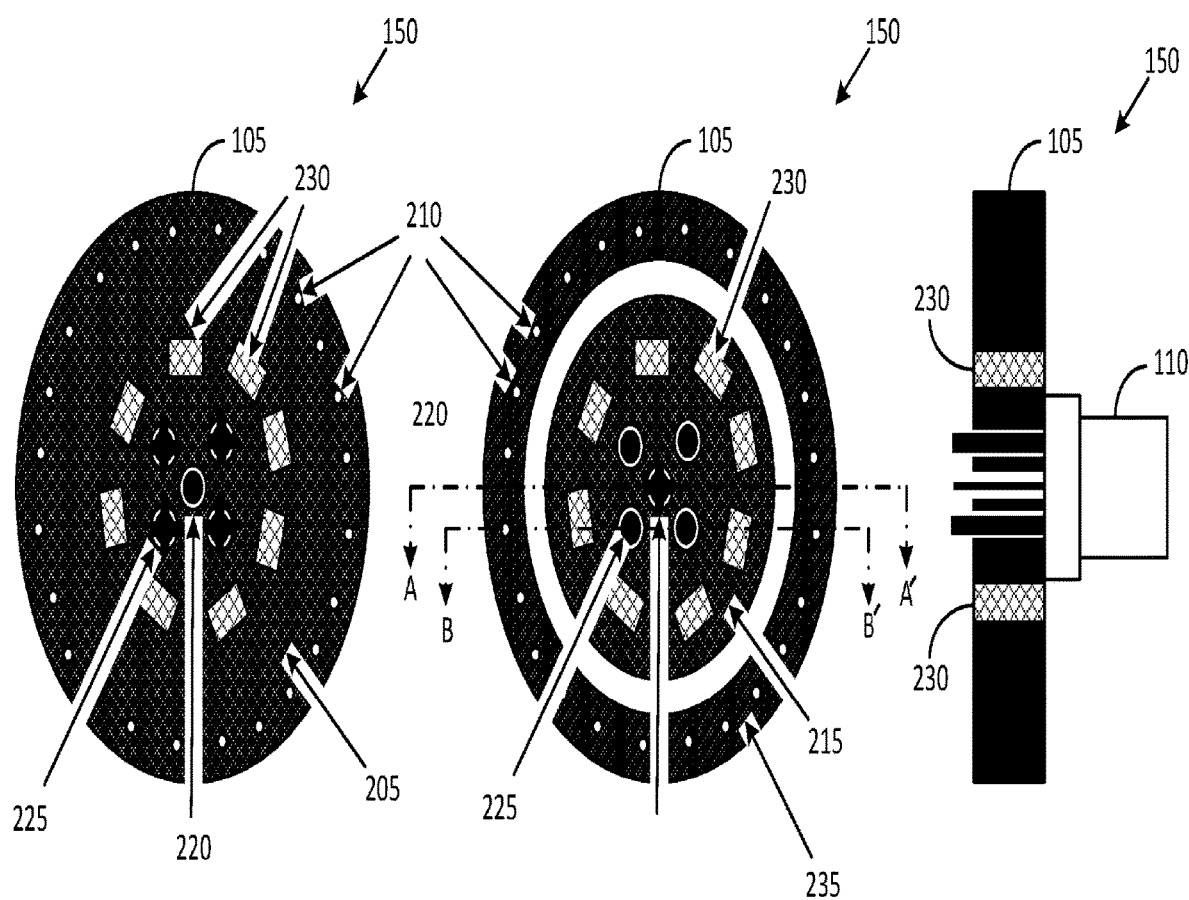
FIG. 2A shows a top view of a baseplate of the exemplary test fixture in accordance with an exemplary embodiment of the disclosure.
FIG. 2B shows a bottom view of a baseplate the exemplary test fixture in accordance with an exemplary embodiment of the disclosure.
FIG. 2C shows a cross-sectional side view of a baseplate of the exemplary test fixture in accordance with an exemplary embodiment of the disclosure.

FIG. 2A shows a top view of the baseplate 105 of the test fixture 150 in accordance with an exemplary embodiment of the disclosure. The top view of the test fixture 150 shows a first metallic zone 205 located upon a first major surface of the baseplate 105 (the top surface). In one exemplary implementation, the first metallic zone 205 is a copper zone on a top surface of a PCB that constitutes the baseplate 105. In another exemplary implementation, the first metallic zone 205 is a copper zone on a top surface of a substrate, a pad, or any other platform that constitutes the baseplate 105. A central portion of the baseplate 105 has a set of solder pads used for soldering the coaxial connector 110 to the baseplate 105. In this exemplary embodiment, the coaxial connector 110 is a through-hole RF connector, and the set of solder pads includes a central pad 220 having a plated through hole extending through the baseplate 105 from the first major surface to a second major surface on the reverse side of the baseplate 105. A center pin of the coaxial connector 110 is inserted into the plated through hole and soldered to a portion of the central pad 220 that is located on the reverse side of the baseplate 105, thereby connecting the center pin of the coaxial connector 110 to a second metallic zone 215 on the bottom surface of the baseplate 105.

The set of solder pads includes additional pads (four in this example embodiment) that are connected to the first metallic zone 205 on the top surface of the baseplate 105. Each of these additional pads, one of which is identified as a solder pad 225, has plated through holes (or non-plated through holes in some implementations) for insertion of mounting pins of the coaxial connector 110. The mounting pins are soldered to the pads, thereby connecting the mounting pins and the body of the coaxial connector 110 to the first metallic zone 205 on the top surface of the baseplate 105.

FIG. 2A further shows a set of slots 230 surrounding the set of solder pads used for mounting the coaxial connector. In this exemplary embodiment, the baseplate 105 is a circular baseplate and the set of slots 230 is a set of non-plated through slots 230 arranged in a circular pattern surrounding the coaxial connector 110. In other embodiments, the baseplate 105 can have other shapes such as an oval shape or a quadrilateral shape and the set of slots 230 can be arranged in other patterns such as an oval pattern or a quadrilateral pattern (square pattern, rectangular pattern etc.). Each of the set of slots 230 has dimensions that accommodate insertion of a resistor into the slot. For example, each of the set of slots 230 can have a rectangular profile (a rectangular slot) or a square profile (a square slot) that correspond to surface mount resistors having a rectangular shape or a square shape.

In this exemplary embodiment, there are eight slots that accommodate insertion of a set of eight surface mount resistors. The set of eight surface mount resistors may be substantially identical to each other in shape and may or may not be identical to each other in resistance values. In other embodiments, fewer or greater number of slots can be provided for insertion of fewer or more resistors. The longitudinal dimension of each surface mount resistor is substantially equal to a separation distance between the first major surface (top surface) and the second major surface (bottom surface) of the baseplate 105. In one exemplary implementation, this configuration may be achieved by selecting the thickness of the baseplate 105 to match the longitudinal dimension of each surface mount resistor. In another exemplary implementation, this configuration may be achieved by selecting resistors having dimensions that match the thickness of the baseplate 105.

Consequently, a first planar terminal of each surface mount resistor is substantially aligned (coplanar) with the top surface of the baseplate 105 and a second planar terminal of each surface mount resistor is substantially aligned (coplanar) with the bottom surface of the baseplate 105. The first planar terminal is soldered to the top surface of the baseplate 105 and the second planar terminal is soldered to the bottom surface of the baseplate 105.

The soldering creates small solder bumps on the two major surfaces, which may be acceptable in various applications. However, in an exemplary implementation, the solder bumps can be substantially eliminated, or at least minimized, by selecting the thickness of the baseplate 105 to exceed the longitudinal dimension of each surface mount resistor. The thickness of the baseplate 105 can thus be selected to form a cavity at either planar terminal of a surface mount resistor when inserted into a slot, the cavity allowing for accumulation of solder when the first planar terminal is soldered to the top surface of the baseplate 105 and the second planar terminal is soldered to the bottom surface of the baseplate 105.

Soldering surface mount resistors in the manner described above (with or without solder bumps) eliminates introduction of an inductive component as may happen if resistors with leads were used instead. The leads of such resistors may operate as inductors that adversely affect the overall impedance encountered by the current flow through such resistors, particularly when a frequency of operation of the RF circuit 145 is relatively high (in the GHz region, for example). However, when a frequency of operation of the RF circuit 145 is relatively low (in the KHz or MHz region, for example), the surface mount resistors can be replaced by resistors with leads in accordance with some exemplary embodiments of the disclosure.

Leaded resistors typically have a cylindrical body with a longitudinal dimension that exceeds the thickness of the baseplate 105. Consequently, in one exemplary implementation in accordance with disclosure, each of the set of slots 230 can be a circular non-plated through slot having dimensions that accommodate insertion of a cylindrical body of a resistor with leads. A first lead of the leaded resistor can be suitably bent for soldering on to the first metallic zone 205 that is located on the top surface of the baseplate 105 and a second lead suitably bent for soldering on to the second metallic zone 215 that is located on the bottom surface of the baseplate 105.

Irrespective of the nature of resistors used, the circular configuration of the set of slots 230 provides for a set of parallel current paths that are substantially equal in length to each other. The magnitude of current flowing through each of these equidistant current paths can be matched to each another by matching the resistance value of each of the set of resistors inserted into the set of slots 230, thereby providing a substantially similar impedance in each of the current paths.

Non-circular configurations can be utilized in some exemplary implementations for providing impedance matching between two or more current paths by changing the length of PCB metal tracks, for example. Furthermore, additional resistors may be mounted upon the first metallic zone 205 on the top surface of the baseplate 105 and/or the second metallic zone 215 on the bottom surface of the baseplate 105 in order to increase an impedance of one or more current paths.

FIG. 2B shows a bottom view of the baseplate 105 of the exemplary test fixture 150. The footprint of the solder pads located in a central region of the bottom surface of the baseplate 105 matches the footprint of the solder pads located in the central region of the top surface of the baseplate 105. The bottom surface of the baseplate 105 not only includes the second metallic zone 215 but also a third metallic zone 235. The third metallic zone 235 is electrically connected to the first metallic zone 205 on the top surface of the baseplate 105 by a number of plated through holes 210. The axis indicators A-A' and B-B' that are shown in FIG. 2B are described below using other figures.

FIG. 2C shows a cross-sectional side view of the baseplate 105 of the test fixture 150 with the coaxial connector 110 mounted on the baseplate 105. The center pin of the coaxial connector 110 extends through the plated through hole in the central pad 220. The mounting pins of the coaxial connector 110 extend through the plated through holes of the pads surrounding the central pad 220 such as the solder pad 225.

Figure 3:
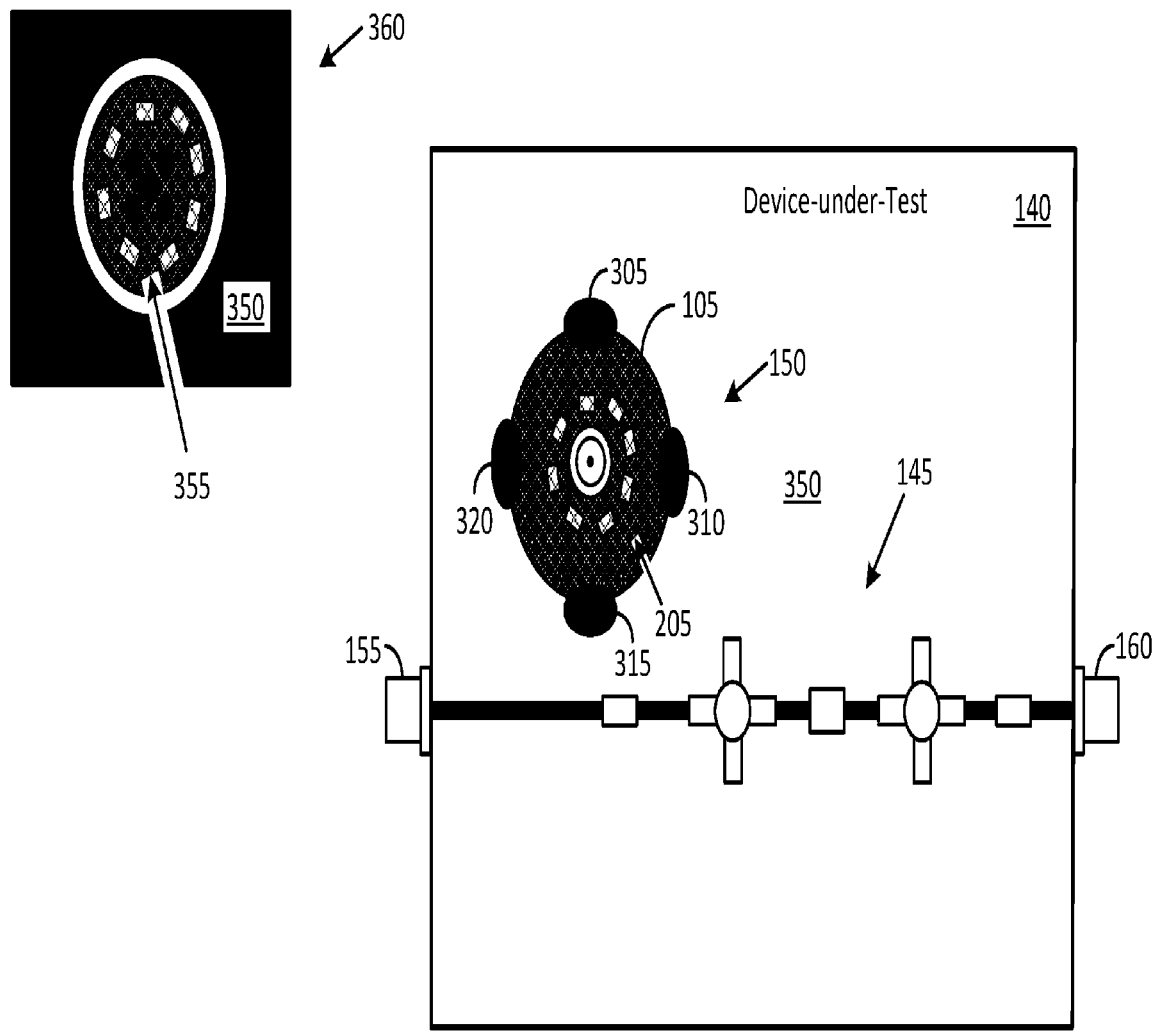
FIG. 3 shows the exemplary test fixture mounted upon a device under test in accordance with an exemplary embodiment of the disclosure.

FIG. 3 shows the test fixture 150 mounted upon a DUT 140 in accordance with an exemplary embodiment of the disclosure. The DUT 140 includes an RF circuit 145 that has several RF transistors connected together in the form of an RF amplifier to provide amplification to an input signal coupled into an input connector 155 of the DUT 140. In this exemplary embodiment, the various components of the RF circuit 145 are surface mount components that are soldered on to a metallic zone 350 of the DUT 140. The metallic zone 350 may be configured to operate as a ground plane to the RF circuit 145 by suitable connections to a grounding element (not shown). In this exemplary embodiment, the test fixture 150 is soldered to the metallic zone 350 by using multiple solder joints (such as solder joint 305, solder joint 310, solder joint 315, and solder joint 320). In other exemplary embodiments, the test fixture 150 may be soldered to the metallic zone 350 by applying solder all over a portion of the upper surface and a rim of the baseplate 105 and by using any of various soldering techniques such as surface mounting soldering techniques.

In this exemplary embodiment, when the baseplate 105 of the test fixture 150 is soldered to the metallic zone 350 of the DUT 140, the body of the coaxial connector 110 is automatically placed at ground potential. However, in other embodiments, the metallic zone 350 may be placed at a voltage potential other than ground (a negative voltage potential, for example) and the body of the coaxial connector 110 will accordingly correspond to this other voltage potential.

A portion 360 of the metallic zone 350 is shown for purposes of describing a footprint that may be provided upon the metallic zone 350 for mounting the test fixture 150. The footprint allows for current to flow from a portion of the RF circuit 145 into a metallic zone 355 that is a part of the metallic zone 350, and upwards through each of the set of resistors into the first metallic zone 205 on the top surface of the test fixture 150. The current then flows from the first metallic zone 205 and through the plated through holes 210 into the metallic zone 350 on the bottom surface of the DUT 140. The voltage drop across the set of resistors as a result of the current flow can be observed by connecting the oscilloscope 115 as described above.

Figure 4:
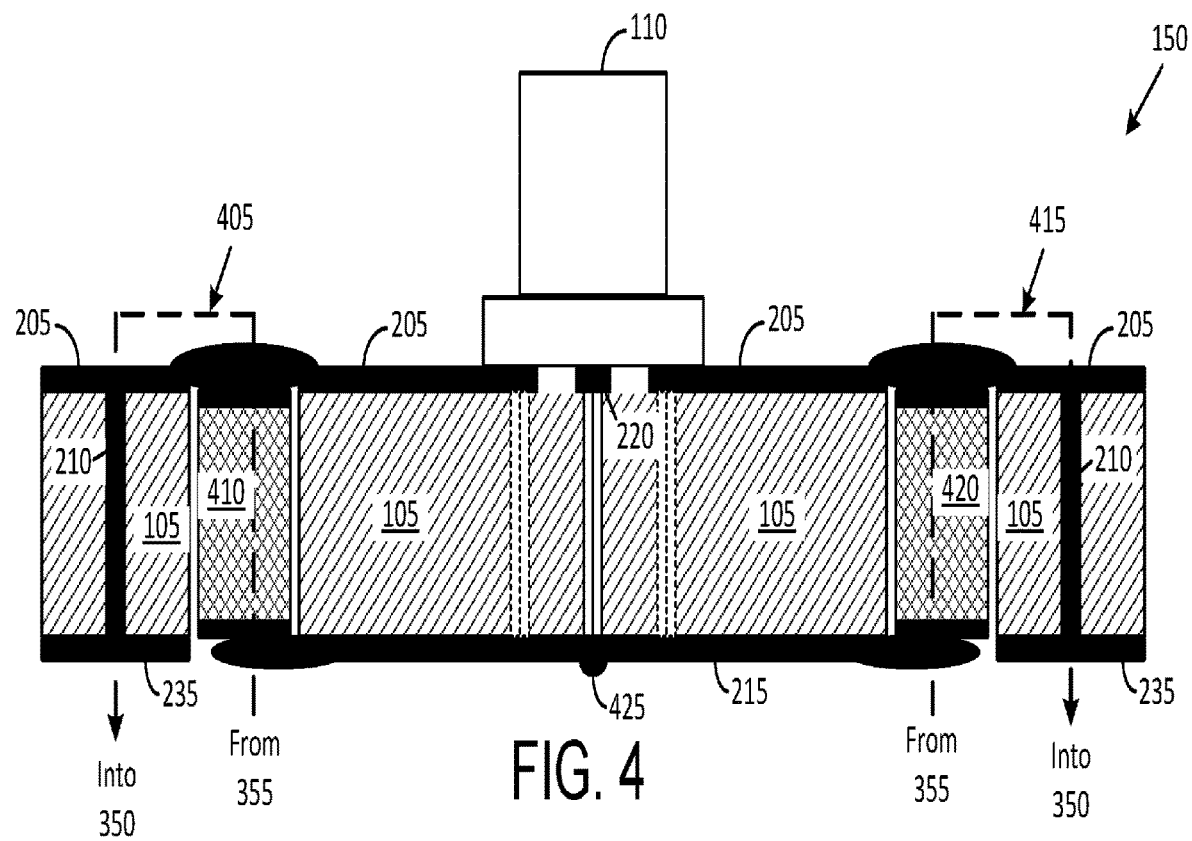
FIG. 4 shows a first cross-sectional view of the exemplary test fixture to illustrate an interconnection between a baseplate and a center terminal of a through-hole coaxial connector in accordance with an exemplary embodiment of the disclosure.

FIG. 4 shows a first cross-sectional view of the test fixture 150 to illustrate an interconnection between the baseplate 105 and the center pin of the coaxial connector 110 in accordance with an exemplary embodiment of the disclosure. The first cross-sectional view is indicated by the axis indicator A-A' in FIG. 2B. The center pin of the coaxial connector 110, which is a through-hole RF connector in this example, is inserted into the plated through hole in the central pad 220 and soldered to the second metallic zone 215 on the bottom surface of the baseplate 105 as indicated by a solder joint 425. When the test fixture 150 is mounted upon the DUT 140, the second metallic zone 215 is soldered on to the metallic zone 355 (shown in FIG. 3). Current from a portion of the RF circuit 145 flows into the metallic zone 355 and flows through the metallic zone 215 and through each of the set of resistors inserted into the set of slots 230. The current flows are illustrated in FIG. 4 by a first current path 405 and a second current path 415.

The first current path 405 has current flow from the metallic zone 355 on the DUT 140 to the metallic zone 215 on the bottom surface of the baseplate 105, upwards through the resistor 410, through the metallic zone 205 located on the top surface of the baseplate 105, downwards through the plated through hole 210 into the third metallic zone 235 on the bottom surface of the baseplate 105, and into the metallic zone 350 of the DUT 140.

The second current path 415 has current flow from the metallic zone 355 of the DUT 140 to the metallic zone 215 on the bottom surface of the baseplate 105, upwards through the resistor 420, through the metallic zone 205 located on the top surface of the baseplate 105, downwards through the plated through hole 210 into the third metallic zone 235 on the bottom surface of the baseplate 105, and into the metallic zone 350 of the DUT 140.

It should be understood that in some implementations, the current flows can be in the opposite direction to what is shown in FIG. 4 and other figures, depending upon the configuration of the DUT 140. For example, the first current path 405 may have current flow from the metallic zone 350 of the DUT 140 into the test fixture 150 and from the test fixture 150 to the metallic zone 355 of the DUT 140.

Figure 5:
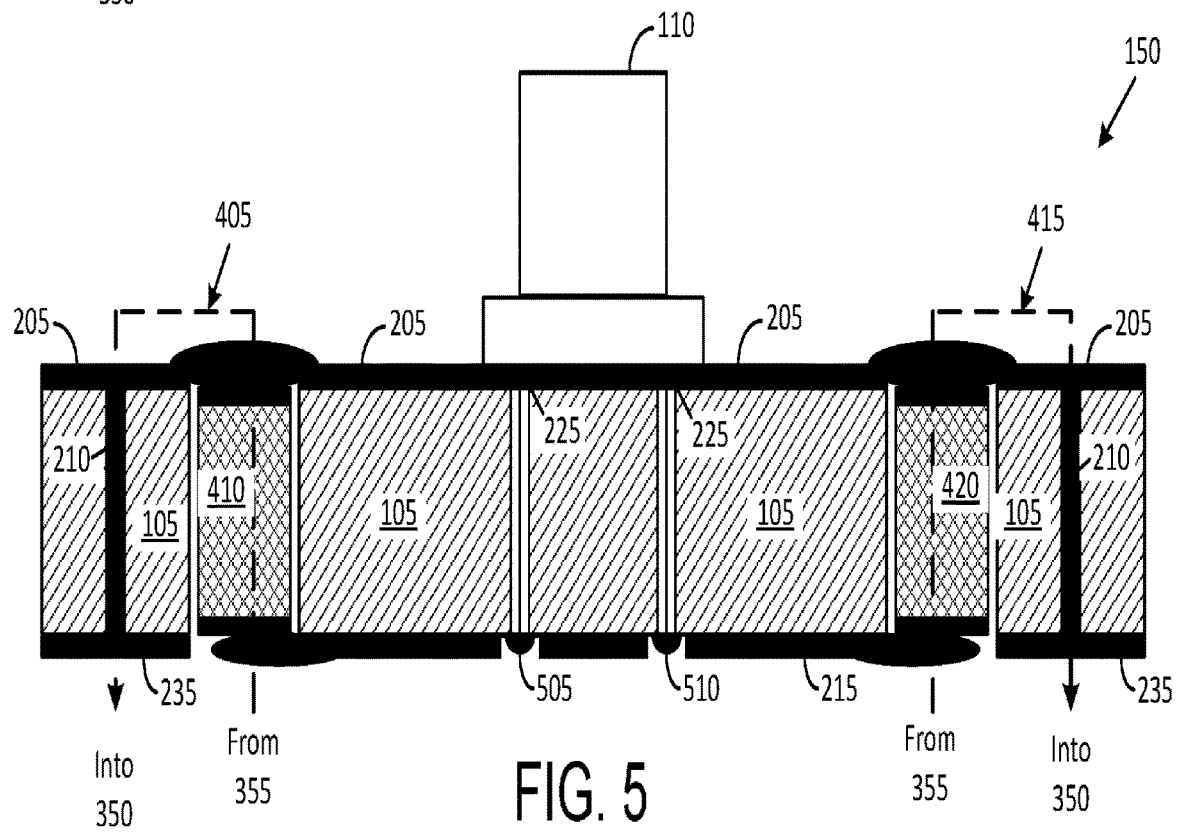
FIG. 5 shows a second cross-sectional view of the exemplary test fixture to illustrate an interconnection between the baseplate and another terminal of the through-hole coaxial connector in accordance with an exemplary embodiment of the disclosure.

FIG. 5 shows a second cross-sectional view of the test fixture 150 to illustrate an interconnection between the baseplate 105 and the mounting pins of the coaxial connector 110 in accordance with an exemplary embodiment of the disclosure. The second cross-sectional view is indicated by the axis indicator B-B' in FIG. 2B. The mounting pins of the coaxial connector 110 are inserted into the holes in the four solder pads shown in FIG. 2A and identified by the solder pad 225. The mounting pins are soldered to the second metallic zone 215 on the bottom surface of the baseplate 105 as indicated by a first solder joint 505 and a second solder joint 510. Each of the first solder joint 505 and the second solder joint 510 are electrically isolated from the second metallic zone 215 on the bottom surface of the baseplate 105 by providing an insulating gap between the four solder pads on the bottom surface of the baseplate 105 and the second metallic zone 215.

The current flow through the first current path 405 (current flow described above) runs parallel to the current flow through the second current path 415 (current flow described above) and the resulting voltage drop across the resistors is coupled into the center pin and the mounting pins of the coaxial connector 110 for observing on an observation instrument.

Figure 6:
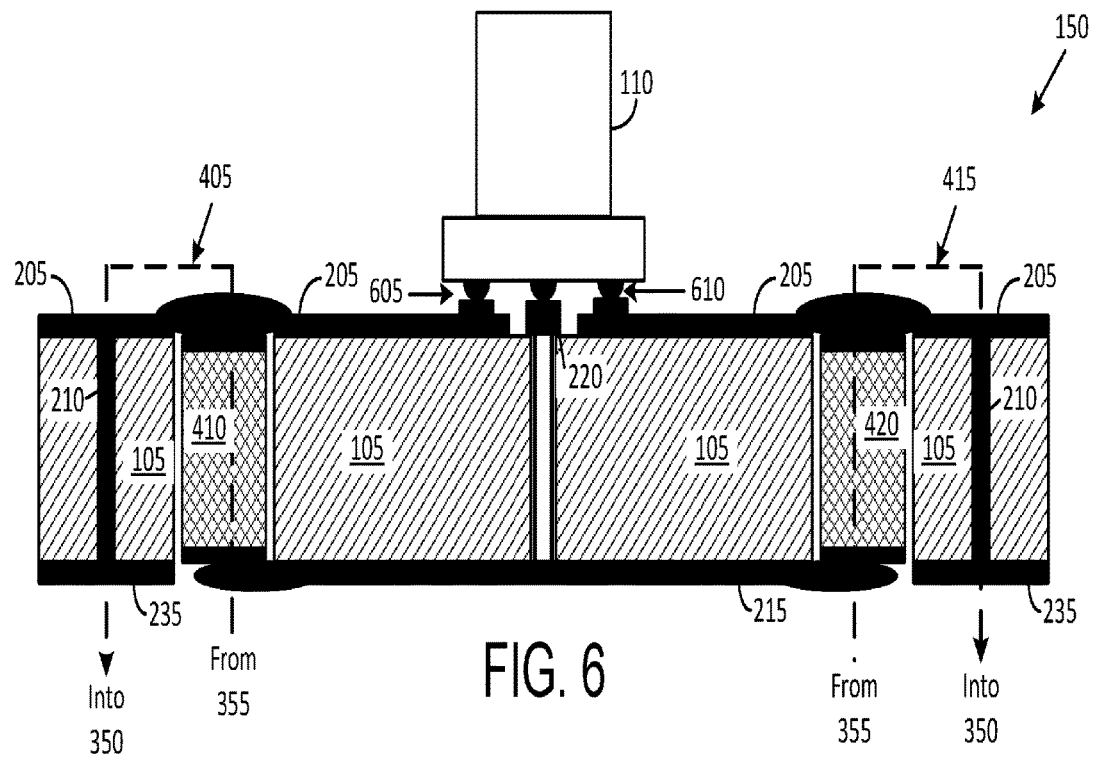
FIG. 6 shows a third cross-sectional view of the exemplary test fixture to illustrate an interconnection between the baseplate and a surface mount coaxial connector in accordance with an exemplary embodiment of the disclosure.

FIG. 6 shows a third cross-sectional view of the test fixture 150 to illustrate an interconnection between the baseplate 105 and the pins of the coaxial connector 110 when the coaxial connector 110 is a surface mountable radio-frequency (RF) connector in accordance with an exemplary embodiment of the disclosure. The third cross-sectional view is indicated by the axis indicator A-A' in FIG. 2B.

In this exemplary embodiment, the central pad 220 on the top surface of the baseplate 105 is connected to the second metallic zone 215 on the bottom surface of the baseplate 105 by a plated through hole that extends through the baseplate 105. A surface-mountable center terminal of the coaxial connector 110 is soldered to the central pad 220 on the top surface of the baseplate 105 (by using a surface mount soldering technique) thereby connecting the center terminal of the coaxial connector 110 to the second metallic zone 215 on the bottom surface of the baseplate 105.

In lieu of the mounting pins that are provided in a through-hole RF connector, the coaxial connector 110 in this embodiment has several surface-mountable mounting terminals, such as terminal 605 and terminal 610. The surface-mountable terminals are soldered to the first metallic zone 205 on the top surface of the baseplate 105. The current path 405 and current path 415 are as described above and the resulting voltage drop can be observed by using an oscilloscope coupled to the coaxial connector 110.

Figure 7:
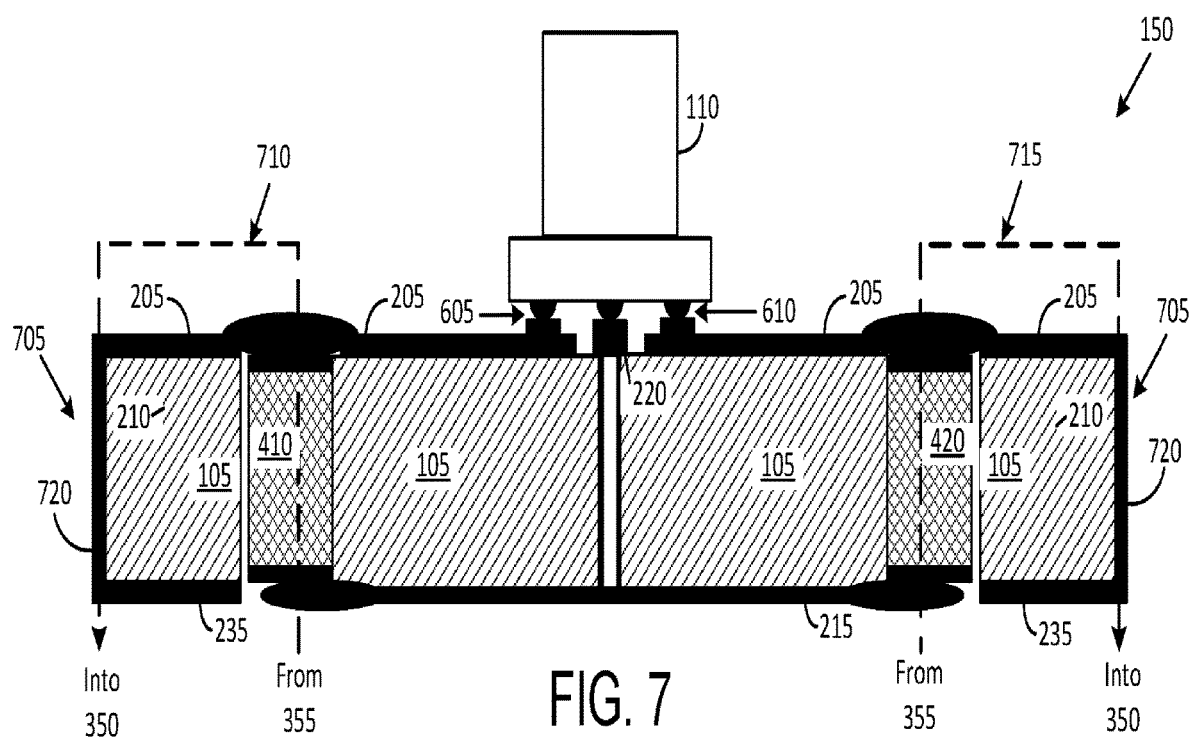
FIG. 7 shows a fourth cross-sectional view of the exemplary test fixture to illustrate an alternative configuration for current paths in accordance with an exemplary embodiment of the disclosure.

FIG. 7 shows a fourth cross-sectional view of the test fixture 150 to illustrate an alternative configuration for current paths in accordance with an exemplary embodiment of the disclosure. The fourth cross-sectional view is indicated by the axis indicator A-A' in FIG. 2B. In this exemplary embodiment, the plated through holes 210 described above may be replaced, or supplemented, with a fourth metallic zone 720 on a rim portion 705 of the baseplate 105. The fourth metallic zone 720 is connected to the first metallic zone 205 on the top surface of the baseplate 105 and the third metallic zone 235 on the bottom surface of the baseplate 105.

The first current path 710 in this exemplary embodiment has current flow from the metallic zone 355 of the DUT 140 to the metallic zone 215 on the bottom surface of the baseplate 105, upwards through the resistor 410, through the metallic zone 205 located on the top surface of the baseplate 105, downwards through the fourth metallic zone 720 in the rim portion 705 of the baseplate 105, to the third metallic zone 235 on the bottom surface of the baseplate 105, and into the metallic zone 350 of the DUT 140.

The second current path 715 in this exemplary embodiment has current flow from the metallic zone 355 of the DUT 140 to the metallic zone 215 on the bottom surface of the baseplate 105, upwards through the resistor 420, through the metallic zone 205 located on the top surface of the baseplate 105, downwards through the fourth metallic zone 720 in the rim portion 705 of the baseplate 105, to the third metallic zone 235 on the bottom surface of the baseplate 105, and into the metallic zone 350 of the DUT 140.

It will be also pertinent to point out that the fourth metallic zone 720 in the rim portion 705 of the baseplate 105 provides increased electrically connectivity between the baseplate 105 and the metallic zone 350 when the test fixture 150 is soldered to the metallic zone 350 of the DUT 140 as illustrated in FIG. 3.

Figure 8:
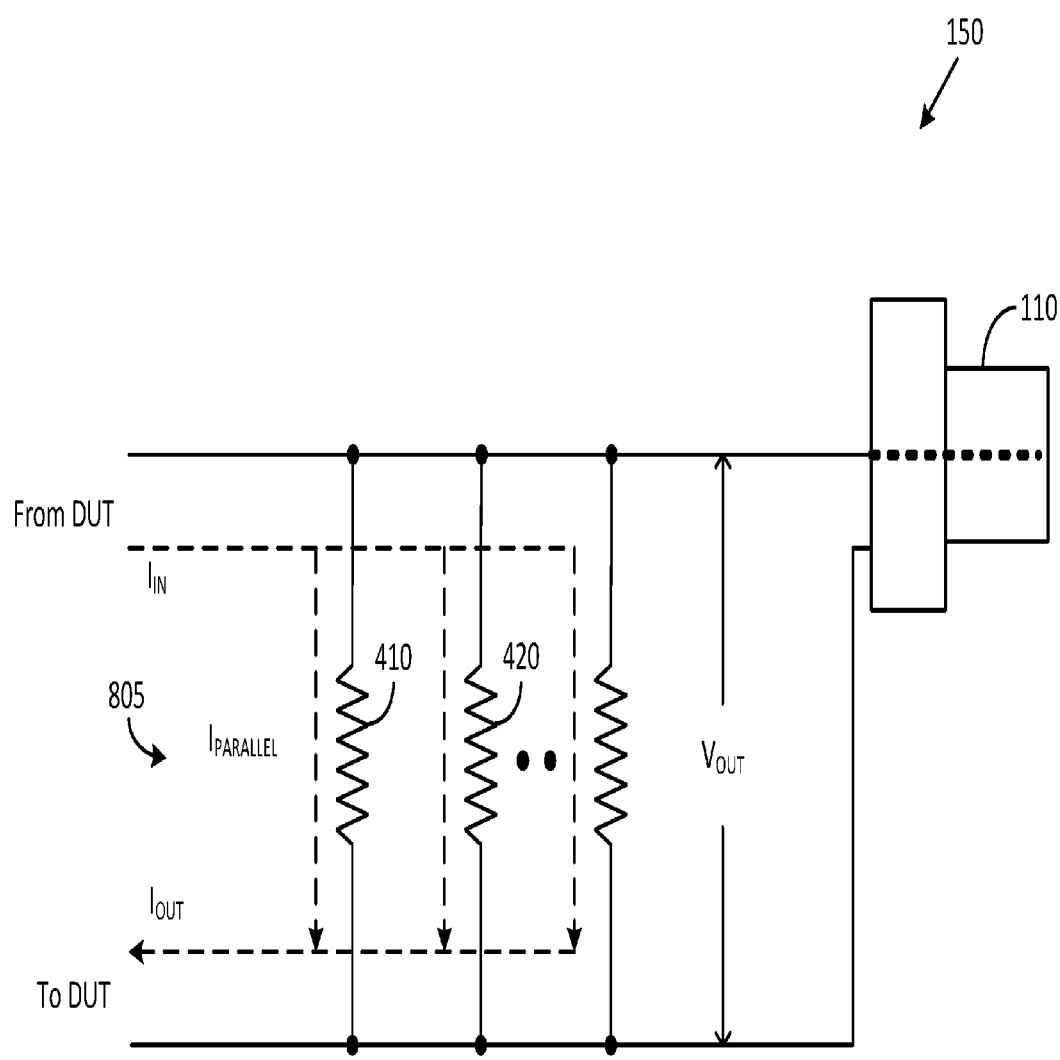
FIG. 8 shows a functional representation of the test fixture when mounted on a device under test in accordance with exemplary embodiments of the disclosure.

FIG. 8 shows a functional representation of the test fixture 150 when mounted on the DUT 140 in accordance with various exemplary embodiments of the disclosure. Current ($I_{IN}$) enters the test fixture 150 from the metallic zone 355 of the DUT 140 (or the metallic zone 350 of the DUT 140) and propagates through a set of "n" resistors 805 and out of the test fixture 150 into the metallic zone 350 of the DUT 140 (or the metallic zone 355 of the DUT 140). The current may originate from a portion of the RF circuit 145 that is shown in FIG. 3 or other portions of the DUT 140.

The set of "n" resistors 805 ($n \geq 2$) includes the resistor 410 and the resistor 420 (that are illustrated in various other figures as well) and may further include (n–2) other resistors. The parallel flow of current ($I_{PARALLEL}$) through the "n" resistors connected in parallel with each other produces a voltage drop ($V_{OUT}$) that is coupled into the coaxial connector 110. An observation instrument can be coupled to the coaxial connector 110 for observing the voltage drop and evaluating characteristics of the current flowing through the resistors. The characteristics of the current flowing through the resistors may provide insight into one or more operational characteristics of the RF circuit 145 on the DUT 140.

FIG. 9 shows an exploded view of an alternative exemplary embodiment of the test fixture 150. This exemplary embodiment includes a baseplate 910 and an electrically-conductive casing 905 that is configured to encase the baseplate 910. The baseplate 910 includes an electrically-conductive mounting rod 915 that extends from a bottom surface of the baseplate 910. In one exemplary implementation, the baseplate 910 is a metal baseplate and the electrically-conductive mounting rod 915 is a threaded metal mounting rod that can be inserted into a threaded hole provided in the DUT 140 shown in FIG. 1. In another exemplary implementation, the baseplate 910 is a metal baseplate and the electrically-conductive mounting rod 915 is a metal mounting rod that can be press-fitted into a hole provided in the DUT 140. In yet another exemplary implementation, the baseplate 910 may include a non-metallic body portion and the electrically-conductive mounting rod 915 is a metal mounting rod that can be inserted (threaded or press-fitted) into a hole provided in the DUT 140.

A plated-through orifice 930 extends from a metallic zone 940 located on a top surface of the baseplate 910 and into a portion of the electrically-conductive mounting rod 915. In this exemplary embodiment, the plated-through orifice 930 is sized to accommodate a press-fit insertion of a center terminal of the coaxial connector 110. The center terminal is connected to a center pin of the coaxial connector 110. When inserted into the plated-through orifice 930, the center terminal of the coaxial connector 110 is electrically connected to the metallic zone 940 on the top surface of the baseplate 910 and also to the electrically-conductive mounting rod 915. This arrangement, which is described below in more detail using another figure, provides electrical connectivity between the electrically-conductive mounting rod 915 and the center pin of the coaxial connector 110.

A set of holes 935 may also be provided that extend downwards into the baseplate 910 from the top surface. Each of the set of holes 935 is sized to accommodate a mounting terminal of the coaxial connector 110 without allowing the mounting terminal to make contact with the metallic zone 940 or other portions of the baseplate 910. Consequently, the mounting terminals of the coaxial connector 110 are electrically isolated from the metallic zone 940.

A set of indentations 925 is provided in the metallic zone 940, the set of indentations 925 surrounding the plated-through orifice 930. In this exemplary implementation, the baseplate 910 is a circular baseplate and the set of indentations 925 is provided on a peripheral portion of the circular baseplate. In another exemplary implementation, the baseplate 910 may have other shapes, such as a square shape, and the set of indentations 925 provided in the metallic zone 940 along the periphery of the exemplary square baseplate. Each indentation in set of indentations 925 is configured to provide seating of a first planar terminal of a respective resistor in a set of resistors such as the set of "n" resistors 805 shown in FIG. 8.

The electrically-conductive casing 905, which may be a metal casing, has a top surface 958 configured for mounting the coaxial connector 110. This feature is described below in more detail using another figure. The electrically-conductive casing 905 includes a central opening 945 that accommodates insertion of the center terminal and other terminals (such as the mounting terminals) of the coaxial connector 110. The center terminal of the coaxial connector 110 extends through the central opening 945 and into the plated-through orifice 930 in the baseplate 910 when the electrically-conductive casing 905 is mated with the baseplate 910.

The electrically-conductive casing 905 includes a rim portion 956 having a bottom edge 957 that is substantially aligned with a bottom surface of the baseplate 910. In one exemplary implementation, the rim portion 956 of the electrically-conductive casing 905 is configured to avoid making contact with an outer vertical surface 926 of the baseplate 910, when the baseplate 910 is made of a metal. In an alternative exemplary implementation, the rim portion 956 of the electrically-conductive casing 905 may be allowed to make contact with the outer vertical surface 926 of the baseplate 910, when the baseplate 910 includes a non-metallic body portion.

A set of indentations 955 is provided on an inner surface 950 of the electrically-conductive casing 905, the set of indentations 955 surrounding the central opening 945. In this exemplary implementation, the electrically-conductive casing 905 has a circular profile that matches the circular baseplate 910. The set of indentations 955 provided in the electrically-conductive casing 905 is spatially aligned with the set of indentations 925 provided in the baseplate 910. Each indentation in the set of indentations 955 is configured to provide seating of a second planar terminal of a respective resistor in the set of resistors such as the set of "n" resistors 805 shown in FIG. 8. Accordingly, the inner surface 950 of the electrically-conductive casing 905 is spatially separated from the metallic zone 940 located on a top surface of the baseplate 910 by a separation distance that substantially corresponds to a height of each of the set of resistors (when the resistors are similar in size to each other).

In an alternative exemplary implementation, one or both of the set of indentations 925 provided on the baseplate 910 and the set of indentations 955 provided on the inner surface 950 of the electrically-conductive casing 905 may be eliminated. Accordingly, when both set of indentations are eliminated, the first planar terminal of each respective resistor in the set of resistors (such as the set of "n" resistors 805 shown in FIG. 8) is placed upon a flat portion of the metallic zone 940 (the flat portions correspond to the set of indentations 925 shown in FIG. 9). The second terminal of each respective resistor in the set of resistors is placed upon a flat portion of the inner surface 950 of the electrically-conductive casing 905 (the flat portions correspond to the set of indentations 955 shown in FIG. 9).

FIG. 10 shows an assembled view of the alternative exemplary embodiment of the test fixture 150 that is shown in FIG. 9. In the mated condition, the electrically-conductive casing 905 is mated with, and encases, the baseplate 910. When mounted upon the DUT 140, the bottom edge 957 of the rim portion 956 makes contact with the metallic zone 350 located on the top surface of the DUT 140.

Figure 11:
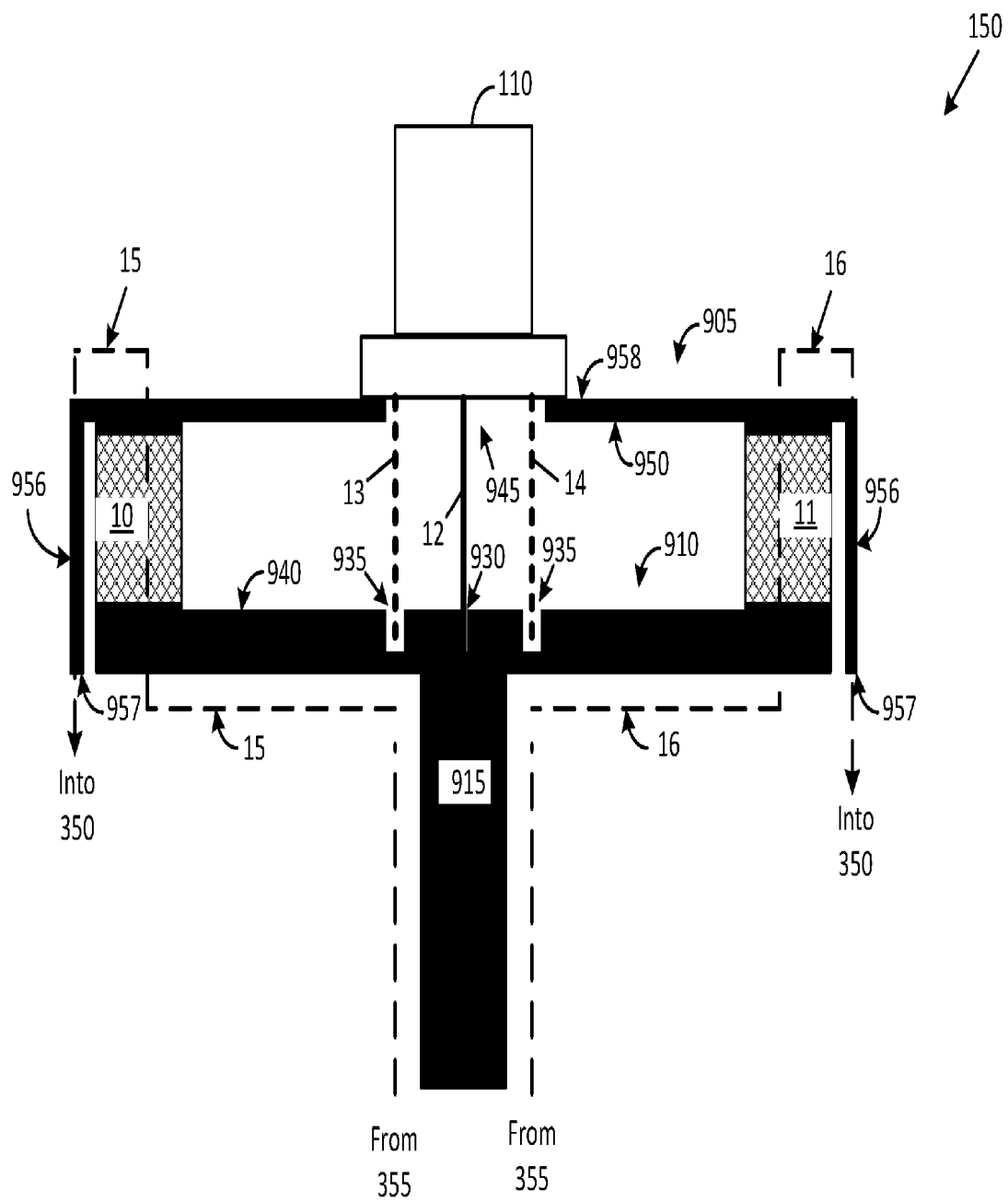
FIG. 11 shows a first cross-sectional view of the alternative exemplary test fixture shown in FIG. 9.

FIG. 11 shows a first cross-sectional view of the alternative exemplary test fixture 150. In this exemplary implementation, the coaxial connector 110 is mounted upon the top surface 958 of the electrically-conductive casing 905, which can be a metal casing. A flange of the coaxial connector 110 is arranged to make contact with the top surface 958 of the electrically-conductive casing 905. If more electrical conductivity is desired, the flange and/or a cylindrical body portion of the coaxial connector 110 may be soldered to the top surface 958.

A center terminal 12 of the coaxial connector 110 is press-fitted into the plated-through orifice 930 on the baseplate 910, thereby electrically connecting the center terminal 12 to the metallic zone 940 located on the top surface of the DUT 140 and to the electrically-conductive mounting rod 915 of the baseplate 910. A first mounting pin 13 and a second mounting pin 14 that are two of two or more mounting pins of the coaxial connector 110 extend downwards through the central opening 945 in the electrically-conductive casing 905 and into the set of holes 935 in the baseplate 910. The diameter and depth of each hole in the set of holes 935 is larger than a diameter and length of each of the mounting pins, thereby preventing the mounting pins from making contact with the baseplate 910. In an alternative implementation, the mounting pins of the coaxial connector 110 may be eliminated (by cutting, for example), thereby eliminating the need to provide the set of holes 935 in the baseplate 910.

The set of resistors may be placed on the set of indentations 925 provided on the baseplate 910, prior to mating the electrically-conductive casing 905 with the baseplate 910. When mated, the set of resistors automatically make contact with the set of indentations 955 in the electrically-conductive casing 905. The assembled test fixture 150 can then be mounted upon the DUT 140 by inserting the electrically-conductive mounting rod 915 into a hole provided in the metallic zone 355 on the DUT 140, thus providing electrical conductivity between the electrically-conductive mounting rod 915 and the metallic zone 355. The bottom edge 957 makes contact with the metallic zone 350 on the DUT 140.

Current flows from the metallic zone 355 and into the test fixture 150 through the electrically-conductive mounting rod 915. The current then flows in multiple directions through the metallic zone 940 that is located on the top surface of the baseplate 910 and towards the set of resistors mounted on the set of indentations 925. An exemplary current flow 15 indicates the current propagating through the metallic zone 940 and towards a resistor 10 among the set of resistors. The current then goes upwards through the resistor 10 into the top surface 958 of the electrically-conductive casing 905, and then downwards through the rim portion 956 and into the metallic zone 350 on the DUT 140. Another exemplary current flow 16 indicates the current propagating through the metallic zone 940 and towards another resistor 11 among the set of resistors. The current then goes upwards through the resistor 11 into the top surface 958 of the electrically-conductive casing 905, and then downwards through the rim portion 956 and into the metallic zone 350 on the DUT 140.

Similar current flows take place through each of the other resistors in the set of resistors. The resulting voltage drop across the set of resistors is available between the center terminal 12 and the cylindrical body portion of the coaxial connector 110. The voltage drop can be observed by coupling an observation instrument such as the oscilloscope 115 to the coaxial connector 110.

Figure 12:
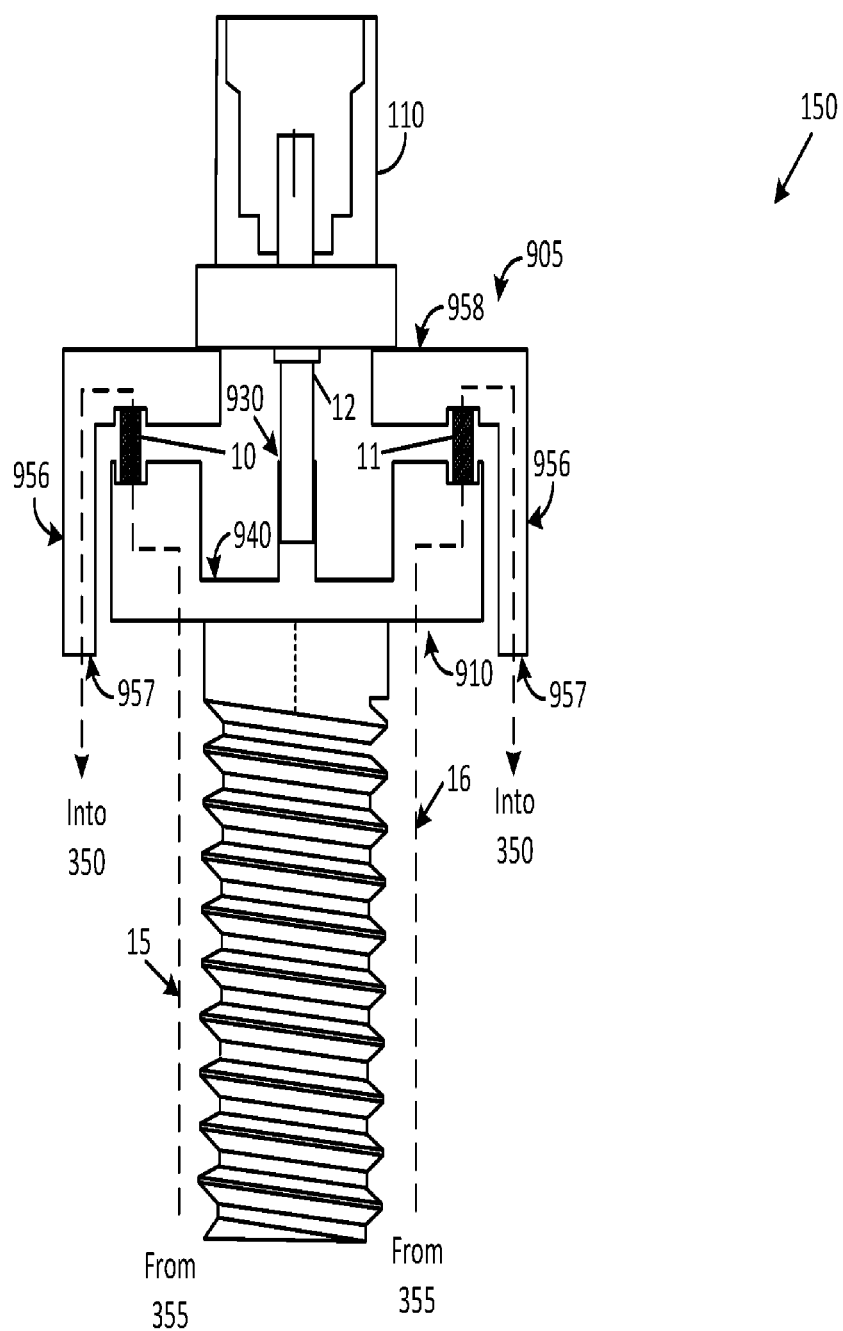
FIG. 12 shows a second cross-sectional view of the alternative exemplary test fixture shown in FIG. 9.

FIG. 12 shows a second cross-sectional view of the alternative exemplary test fixture 150. In this exemplary implementation the mounting pins of the coaxial connector 110 have been cut off, thereby eliminating the need to provide the set of holes 935 in the baseplate 910. The various other parts of the text fixture 150, as well as the current flow paths through the test fixture 150, can be understood from the description provided above with respect to FIG. 11.

In summary, it should be noted that the invention has been described with reference to a few illustrative embodiments for the purpose of demonstrating the principles and concepts of the invention. It will be understood by persons of skill in the art, in view of the description provided herein, that the invention is not limited to these illustrative embodiments. Persons of skill in the art will understand that many such variations can be made to the illustrative embodiments without deviating from the scope of the invention.

What is claimed is:

1. A test fixture comprising:
    a coaxial connector having a first terminal that is connected to a center pin of the coaxial connector;
    a baseplate comprising:
        an electrically-conductive mounting rod extending from a bottom surface of the baseplate;
        a first metallic zone located on a top surface of the baseplate;
        a plated-through orifice extending from the first metallic zone and into a portion of the electrically-conductive mounting rod, the plated-through orifice configured to accommodate a press-fit insertion of the first terminal of the coaxial connector and provide electrical conductivity between the first terminal of the coaxial connector, the first metallic zone, and the electrically-conductive mounting rod;
    an electrically-conductive casing comprising:
        a top surface of the electrically-conductive casing configured for mounting the coaxial connector;
        a central opening through which extends one or more terminals of the coaxial connector that is mounted upon the top surface of the electrically-conductive casing, the one or more terminals of the coaxial connector including the first terminal that is connected to the center pin of the coaxial connector; and
        a rim portion having a bottom edge that is substantially aligned with the bottom surface of the baseplate, the rim portion electrically connected to a cylindrical body portion of the coaxial connector through the electrically-conductive casing; and
    a set of resistors, a first planar terminal of each respective resistor in the set of resistors placed in contact with the first metallic zone located on the top surface of the baseplate and a second planar terminal of each respective resistor in the set of resistors placed in contact with an inner surface of the electrically-conductive casing when the baseplate is encased by the electrically-conductive casing.

2. The test fixture of claim 1, further comprising:
    a first set of indentations located in the first metallic zone and surrounding the plated-through orifice on the top surface of the baseplate, each indentation in the first set of indentations configured to provide seating of the first planar terminal of each respective resistor in the set of resistors; and
    a second set of indentations located in the inner surface of the electrically-conductive casing, each indentation in the second set of indentations configured to provide seating of the second planar terminal of each respective resistor in the set of resistors.

3. The test fixture of claim 1, wherein the electrically-conductive mounting rod is a metal mounting rod and the electrically-conductive casing is a metal casing.

4. The test fixture of claim 1, wherein the electrically-conductive mounting rod is configured for mounting the test fixture upon a device-under-test (DUT) and to make contact with a first portion of a top surface of the DUT, and further wherein the rim portion of the electrically-conductive casing is configured to make contact with a second portion of the top surface of the DUT, the first portion and second portion of the DUT arranged to provide current flow through the test fixture.

5. The test fixture of claim 1, wherein the one or more terminals of the coaxial connector include one or more mounting terminals, the one or more mounting terminals electrically isolated from the baseplate.

* * * * *

UNITED STATES PATENT AND TRADEMARK OFFICE
CERTIFICATE OF CORRECTION

PATENT NO. : 10,884,023 B2
APPLICATION NO. : 16/864344
DATED : January 5, 2021
INVENTOR(S) : Edward Vernon Brush, IV et al.

Page 1 of 1

It is certified that error appears in the above-identified patent and that said Letters Patent is hereby corrected as shown below:

On the Title Page

Column 1, under (71) after "Applicant: Keysight Technologies, Inc., Santa Rosa, CA (US)", please add -- Applicant: University of Tennessee Research Foundation, Knoxville, TN (US) --.

Column 1, under (73) after "Assignee: Keysight Technologies, Inc. Santa Rosa, CA (US)", please add -- Assignee: University of Tennessee Research Foundation, Knoxville, TN (US) --.

Signed and Sealed this
Twenty-third Day of January, 2024

Katherine Kelly Vidal
*Director of the United States Patent and Trademark Office*